(12) United States Patent
Lee et al.

(10) Patent No.: US 7,744,947 B2
(45) Date of Patent: Jun. 29, 2010

(54) METHOD OF FORMING CARBON NANOTUBE ON SEMICONDUCTOR SUBSTRATE, METHOD OF FORMING SEMICONDUCTOR METAL WIRE USING THE SAME, AND METHOD OF FABRICATING INDUCTOR USING THE SAME

(75) Inventors: Byung Chul Lee, Daejeon (KR); Jeong Oen Lee, Daejeon (KR); Yang Kyu Choi, Daejeon (KR); Jun-Bo Yoon, Daejeon (KR)

(73) Assignee: Korea Advanced Institute of Science and Technology (KR)

( * ) Notice: Subject to any disclaimer, the term of this patent is extended or adjusted under 35 U.S.C. 154(b) by 1003 days.

(21) Appl. No.: 11/461,086

(22) Filed: Jul. 31, 2006

(65) Prior Publication Data

US 2010/0130005 A1    May 27, 2010

(30) Foreign Application Priority Data

Aug. 31, 2005    (KR) .................... 10-2005-0080632

(51) Int. Cl.
*B05D 5/12*    (2006.01)
(52) U.S. Cl. ...................... 427/58; 427/97.3
(58) Field of Classification Search ............... 427/58, 427/97.3, 249.1; 977/842
See application file for complete search history.

(56) References Cited

U.S. PATENT DOCUMENTS 6,129,901 A * 10/2000 Moskovits et al. ....... 423/447.3
2002/0193040 A1* 12/2002 Zhou .......................... 445/51

* cited by examiner

*Primary Examiner*—Roberts Culbert
(74) *Attorney, Agent, or Firm*—The Belles Group, P.C.

(57) ABSTRACT

A method of fabricating a semiconductor device by filling carbon nanotubes in a recess is disclosed. The method of fabricating the semiconductor device comprises patterning a mold on a substrate, coating carbon nanotubes on an entire surface of the recess and the mold formed by the patterning, filling the carbon nanotubes coated on the an entire surface of the mold in the recess, and removing the mold.

21 Claims, 7 Drawing Sheets

METHOD OF FORMING CARBON NANOTUBE ON SEMICONDUCTOR SUBSTRATE, METHOD OF FORMING SEMICONDUCTOR METAL WIRE USING THE SAME, AND METHOD OF FABRICATING INDUCTOR USING THE SAME

This Nonprovisional application claims priority under 35 U.S.C. §119(a) on Patent Application No. 10-2005-0080632 filed in Republic of Korea on Aug. 31, 2005, the entire contents of which are hereby incorporated by reference.

BACKGROUND OF THE INVENTION

1. Field of the Invention

The present invention relates to a method of fabricating a semiconductor device, and more particularly, to a method of fabricating a semiconductor device by filling carbon nanotubes in a recess.

2. Description of the Related Art

A carbon nanotube (CNT) used in the art to which the present invention pertains has been discovered by chance during a process of synthesizing fullerene (C60), one of allotrope of carbon. In the carbon nanotube, a carbon atom is combined with three peripheral carbon atoms by hybrid orbital $sp^2$ to form a hexagonal honeycomb pattern and a graphene structure with the hexagonal honeycomb patterns is folded in a cylindrical shape to thereby form the carbon nanotube.

The carbon nanotube is fabricated as a single-wall nanotube (SWNT) and a multi-wall nanotube (MWNT) according to synthesizing conditions, and can be grown in various forms according to synthesizing methods. Several methods have been proposed to synthesize the carbon nanotube, of which an arc discharge method and a laser ablation method allow the carbon nanotube with relatively high purity to synthesize at a laboratory level and a chemical vapor deposition (CVD) method of allowing a large amount of carbon nanotubes to synthesize is commonly used to be applied for a display and a nano device.

Each of the conventional methods will be described in detail.

The laser ablation method can synthesize only the SWNT, and it can obtain relatively high purity, compared to other methods. According to this method, a test sample obtained by mixing a transition metal and graphite powders at a predetermined ratio within a quartz tube of a melting furnace heated to a temperature of 1,200° C. is evaporated by using laser from outside, which is then moved to a cooler through argon, a buffer gas, and then collected.

The arc discharge method, the first introduced synthesizing method, is a fabrication method obtained by modifying an apparatus when the carbon nanotube was first discovered. In this method, carbon nanotubes are formed by discharging arc between two carbon bars. Herein, it is known that the largest amount of carbon nanotubes can be synthesized in an environment having a uniform pressure of 400 to 700 torr with helium gas and a uniform cooling speed.

The CVD is a method in which when a raw material gas comprising a desired material is injected into a reactor, it receives energy from heat or plasma to be decomposed. In this process, the desired material reaches a surface of a substrate to thereby form a film.

However, the conventional synthesizing methods have some problems with respect to their application in using the carbon nanotubes as follows.

The laser ablation method can provide only the SWNT and cannot control a SWNT having semiconductor characteristics and a SWNT having conductor characteristics. In addition, this method cannot synthesize a large amount of carbon nanotubes. Accordingly, this method is not suitable for commercializing carbon nanotube application products.

In case of the arc discharge method, since the carbon nanotubes are formed through an arc discharge between the two carbon bars, it cannot have high purity and can contain various impurities. Like the laser ablation method, this method also has a large structural difficulty in synthesizing a large amount of carbon nanotubes.

Figure 1:
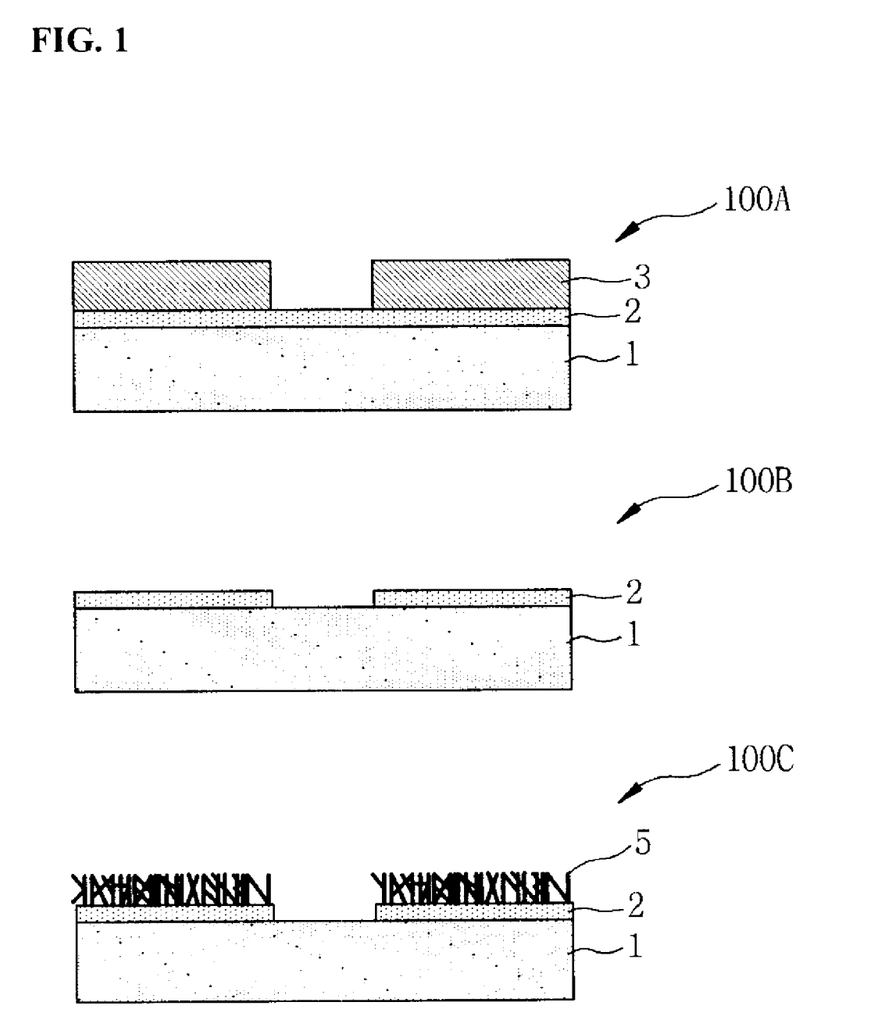
FIG. 1 is a cross-sectional view illustrating sequential processes of a conventional CVD method.

The CVD method allows a large amount of carbon nanotubes to synthesize with relatively high purity, and as shown in FIG. 1, carbon nanotubes can be formed at desired portions by patterning a transition metal, which is a metal catalyst. However, this method also has a problem that the carbon nanotubes are formed only in a vertical direction on the metal catalyst, and since the metal catalyst is requisite for formation of the carbon nanotubes, its application field is limited.

In addition, most of the synthesizing methods require a high temperature process (about 500° C. to 4000° C.). Accordingly, in order to selectively obtain carbon nanotubes, existent methods used in the semiconductor process are quite limited. Moreover, since most of the synthesizing methods cannot form the carbon nanotubes in a multi-layer configuration, their application is limited only to a planar structure.

Furthermore, since the carbon nanotubes synthesized in the directly patterned shape contain various impurities such as amorphous carbon and the metal catalyst, a purification process must be performed on the carbon nanotubes.

FIG. 1 is a cross-sectional view illustrating sequential processes of a conventional CVD method.

As shown in FIG. 1, the structure obtained by performing the processes of the conventional CVD method comprises a substrate 1, a metal catalyst 2, a mold 3, and carbon nanotubes 5.

Processes of forming the carbon nanotubes on the substrate 1 by using the conventional CVD method will now be described.

Reference numeral 100A indicates a step of forming the mold 3 in the processes of the CVD method. In this step, the metal catalyst 2 is mounted on an upper surface of the substrate 1 and then the patterned mold 3 is mounted on an upper surface of the metal catalyst 2. The mold 3 is a sort of a photosensitive material such as photoresist.

Reference numeral 100B indicates a step of patterning the mold 3 mounted on the metal catalyst 2. In this step, infrared rays are applied onto the upper surface of the formed mold 3 for a predetermined time. Accordingly, a portion of the metal catalyst 2 that is received the infrared rays, except for the portion on which the mold 3 is mounted, can be patterned through a photolithography process.

Reference numeral 100C indicates a step of forming carbon nanotubes 5 on the upper surface of the metal catalyst 2 that is patterned through a high temperature (about 500° C. to 4000° C.) synthesizing method.

As afore-mentioned, the processes of the conventional CVD method have the problem that the carbon nanotubes are formed only vertically on the metal catalyst 2 and the metal catalyst 2 is requisite, resulting in a limitation of its application field.

SUMMARY OF THE INVENTION

The present invention is designed to solve such problems of the conventional, and therefore, a first object of the present invention is to provide a method of forming carbon nanotubes on a desired portion in which a large amount of synthesized and purified general carbon nanotubes are dispersed in a solvent and coated on a patterned mold, and after the solvent is evaporated, the carbon nanotubes are filled in a patterned mold recess and made to be dense by using evaporation power of a liquid, and then, the patterned mold is removed to thereby form carbon nanotubes on a desired portion.

A second object of the present invention is to provide a method of forming carbon nanotubes without using, a metal catalyst.

A third object of the present invention is to provide a method for forming an electrode by filling carbon nanotubes in a recess of a patterned mold and performing electrolysis plating in the carbon nanotubes.

A fourth object of the present invention is to fabricate a semiconductor metal wire, an inductor, a capacitor, a resonator, a nanometer-size structure, an MEMS (Micro ElectroMechanical Systems) structure, and the like, with carbon nanotubes.

A fifth object of the present invention is to fabricate a semiconductor metal wire, an inductor, a capacitor, a resonator, a nanometer-size structure, an MEMS structure, and the like, by using electrolysis-plated carbon nanotubes.

To achieve the above objects, there is provided a method of fabricating a semiconductor device by filling carbon nanotubes in a recess, comprising: (a) patterning a mold on an upper surface of a substrate to form a recess; (b) coating carbon nanotubes on an upper surface of the patterned recess and mold; (c) filling the carbon nanotubes that are coated on the upper surface of the mold in the recess; and (d) removing the mold, wherein the carbon nanotubes are distributed in a predetermined solvent.

The carbon nanotubes may be one of single-wall nanotubes and multi-wall nanotubes, or a mixture of the single-wall nanotubes and the multi-wall nanotubes.

The mold may be made of one of photoresist, polymer, a metal, Si, $SiO_2$, an III-IV compound semiconductor, and quartz.

The step (b) of coating the carbon nanotubes may comprise coating the carbon nanotubes that are distributed in the solvent by using a dropper.

The solvent may be one of water, acetone, ethanol, methanol, isopropyl alcohol, and butyl cellosolve acetate.

After the step (C), a step of drying the coated carbon nanotube and the solvent in a vacuum state to evaporate the solvent may be further comprised.

The step (C) of filling the carbon nanotubes that are coated on the upper surface of the mold in the recess is performed with one of a doctor blade, the blade of a knife, a squeegee, a roller, a flat blade made with a wafer cut section.

After the step (c), a step of injecting a liquid into the recess that is filled with the carbon nanotubes; and a step of evaporating the liquid may be further comprised in order to make the carbon nanotubes dense.

The liquid may be one of water, acetone, ethanol, methanol, isopropyl alcohol, and butyl cellosolve acetate.

To achieve the above objects, there is also provided a method of forming semiconductor wire using carbon nanotubes, comprising: (a) patterning a first mold to form a recess on an upper surface of a substrate and forming a first metal electrode layer on the substrate in which the first mold is patterned; (b) coating carbon nanotubes on the upper surface of the first metal electrode layer by using a dropper; (c) filling the carbon nanotubes that are coated on the upper surface of the first metal electrode layer in the recess, and forming a second mold on the upper surface of the first metal electrode layer; (d) plating a second metal electrode layer on an upper surface of the carbon nanotube structure that is filled in the recess; and (e) selectively removing the first mold, the second mold, and the first metal electrode layer, wherein the carbon nanotubes are dispersed in a predetermined solvent.

The first and second metal electrode layers may be made of one of Ag, Al, Au, Cu, Co, Ni, Pt, and Zn.

The step (C) of filling the carbon nanotubes that are coated on the upper surface of the first metal electrode layer in the recess is performed with one of a doctor blade, the blade of a knife, a squeegee, a roller, a flat blade made with a wafer cut section.

The step (d) may comprise selectively plating the second metal electrode layer on the upper surface of the carbon nanotube structure by connecting an electrode to the first metal electrode layer.

The selective plating may be performed using a process of filling the carbon nanotube structure with a metal or a process of covering the carbon nanotube structure with a metal thin film so that the carbon nanotube structure is not plated.

The first and second molds may have the same shape.

To achieve the above objects, there is also provided a method of fabricating an inductor using carbon nanotubes, comprising: (a) forming a first metal electrode layer on an upper surface of a substrate, and then patterning a first mold in a three-dimensional shape on an upper surface of the first metal electrode layer to form a recess and a via hole; (b) plating the inside of the via hole with a second metal electrode layer; (c) forming a third metal electrode layer on the substrate that is formed by the step (b); (d) coating carbon nanotubes on the substrate that is formed by the step (c) by using a dropper, then filling the coated carbon nanotubes in the recess to form a carbon nanotube structure, and injecting a liquid in the recess to make the carbon nanotube structure dense; (e) patterning a second mold on the substrate that is formed by the step (d); (f) plating a fourth metal electrode layer on an upper surface of the carbon nanotube structure; and (g) selectively removing the first mold, the second mold, and the first to third metal electrode layers, wherein the carbon nanotubes are dispersed in a predetermined solvent.

The first and second molds may have the same shape.

To achieve the above objects, there is also provided a method of fabricating a inductor using carbon nanotubes, comprising: (a) patterning a first mold in a three-dimensional shape on an upper surface of a substrate to form a recess and a via hole; (b) forming a first metal electrode layer on the substrate that is formed by the step (a); (c) coating carbon nanotubes on the substrate that is formed by the step (b) by using a dropper, then filling the carbon nanotubes in the recess to form a carbon nanotube structure, and injecting a fluid into the recess to make the carbon nanotube structure dense; (d) forming a second mold on an upper surface of the first metal electrode layer; (e) plating a second metal electrode layer on an upper surface of the carbon nanotube structure; and (f) selectively removing the first mold, the second mold, the first metal electrode layer, and the second metal electrode layer.

The first and second molds may have the same shape.

The foregoing and other objects, features, aspects and advantages of the present invention will become more apparent from the following detailed description of the present invention when taken in conjunction with the accompanying drawings.

BRIEF DESCRIPTION OF THE DRAWINGS

The invention will be described in detail with reference to the following drawings in which like numerals refer to like elements.

DETAILED DESCRIPTION OF THE PREFERRED EMBODIMENT

Preferred embodiments of the present invention will now be described with reference to FIGS. 2 to 7.

<Method of Forming Carbon Nanotubes on a Semiconductor Substrate>

Figure 2:
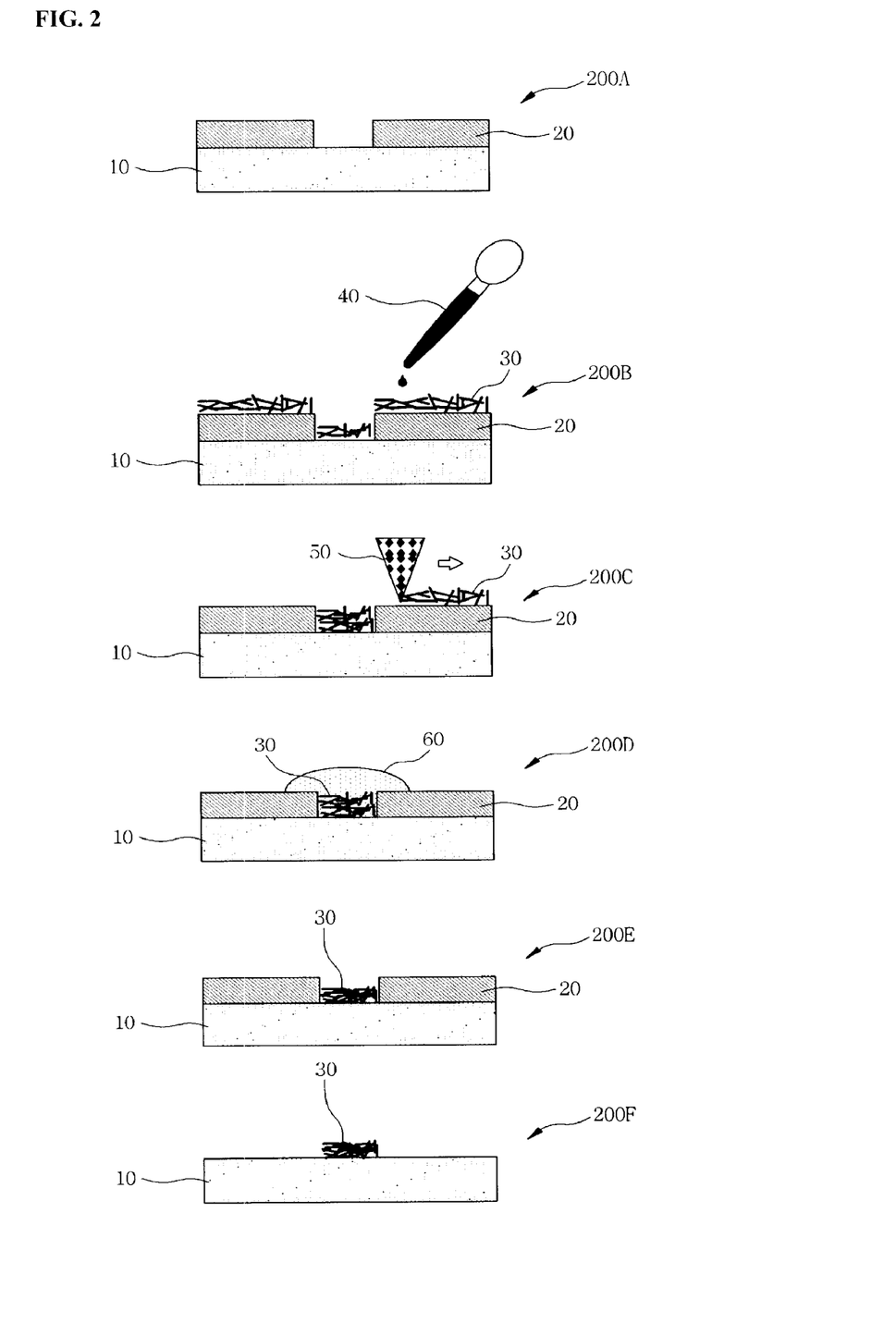
FIG. 2 is a cross-sectional view illustrating sequential processes of a method of forming carbon nanotubes on a semiconductor substrate according to the present invention.

FIG. 2 is a cross-sectional view illustrating sequential processes of a method of forming carbon nanotubes on a semiconductor substrate according to the present invention.

Reference numeral 200A indicates a step of patterning portions of a substrate 10 on which carbon nanotubes 30 are desired to be formed with a mold 20. The mold 20 is made of one of photoresist, polymer, a metal, Si, $SiO_2$, an III-IV compound semiconductor, and quartz. Patterning of the mold 20 is performed through a conventional photolithography process. A recess in which the carbon nanotubes 30 are to be filled is formed at the patterned mold 20.

As a follow-up step of patterning the mold, reference numeral 200B indicates a step of coating the carbon nanotubes 30 on an upper surface of the recess and the mold 20 that are formed by the patterning. The carbon nanotubes 30 are one of single-wall nanotubes and multi-wall nanotubes or a mixture of the single-wall nanotubes and the multi-wall nanotubes. After the carbon nanotubes 30 are dispersed in a solvent through an ultrasonic distributor for about six hours, they are distributed on the recess and the mold 20 by using a dropper 40. The substrate 10 with the coated carbon nanotubes 30 and the solvent mounted thereon is dried in a vacuum state to evaporate the solvent, which is repeatedly performed. As other methods, a method of uniformly distributing the dispersed solvent through spinning and a method of evaporating the solvent by applying heat may be also used. As the solvent, one of water, acetone, ethanol, methanol, isopropyl alcohol (IPA), and butyl cellosolve acetate (BCA) may be used. In addition, a volatile organic solvent that may be used in a laboratory, except for acid, may be also used.

As a follow-up step of coating the carbon nanotubes 30, reference numeral 200C indicates a step of filling the carbon nanotubes 30 that are coated on the an entire surface of the mold 20 in the recess. The dried carbon nanotubes 30 are filled in the recess with a flat tool 50. The tool 50 is one of a doctor blade, the blade of a knife, a squeegee, a roller, a flat blade made with a wafer cut section. That is, a uniformly flat blade is used as the tool 50.

As a follow-up step of filling carbon nanotubes 30 in the recess, reference numeral 200D indicates a step of injecting a liquid 60 into the recess that is filled with the carbon nanotubes 30. The carbon nanotubes 30 become dense by using evaporation power of the liquid 60. When the liquid 60 is evaporated due to a difference of surface tension between the patterned mold 20 and the substrate 10, it is evaporated on the recess. As for the liquid 60, the greater difference in the surface tension the material has, the stronger power can be formed. The liquid 60 may be one of water, acetone, ethanol, methanol, isopropyl alcohol, and butyl cellosolve acetate.

As a follow-up step of injecting the liquid 60, reference numeral 200E indicates a step of making the carbon nanotubes 30 dense by using the evaporation power of the liquid 60.

As a follow-up step of making the carbon nanotubes 30 dense, reference numeral 200F indicates a step of removing the mold 20 to thereby form the carbon nanotubes 30. The mold 20 is removed through the conventional photolithography process.

Figure 3:
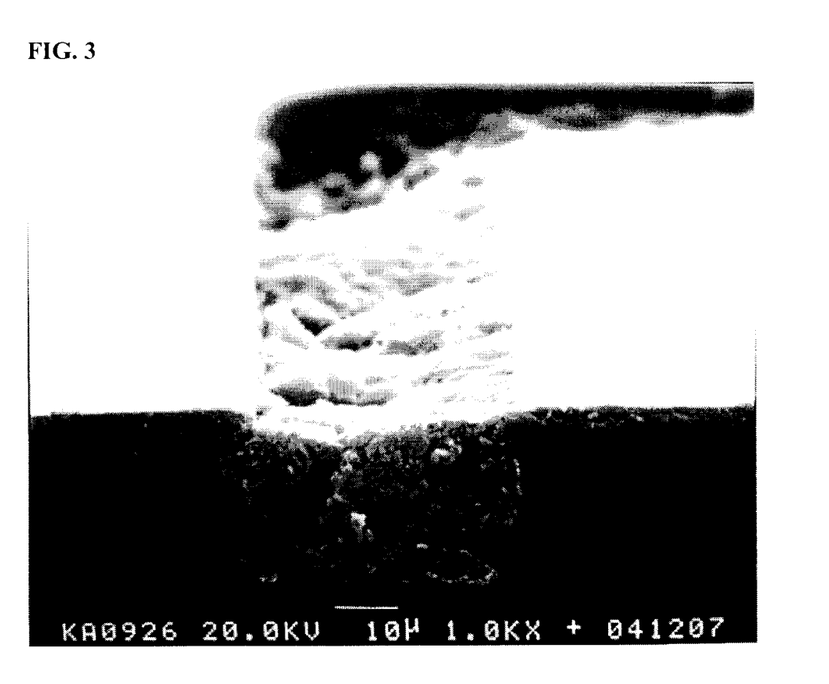
FIG. 3 is a picture of carbon nanotubes formed on the substrate of FIG. 2 taken by an electron microscope.

FIG. 3 is a picture of carbon nanotubes formed in a mold recess that is obtained through a method of fabricating a semiconductor taken by an electron microscope according to the present invention.

<Method of Forming a Semiconductor Wire Using the Method of Forming the Carbon Nanotubes on the Semiconductor Substrate>

Figure 4:
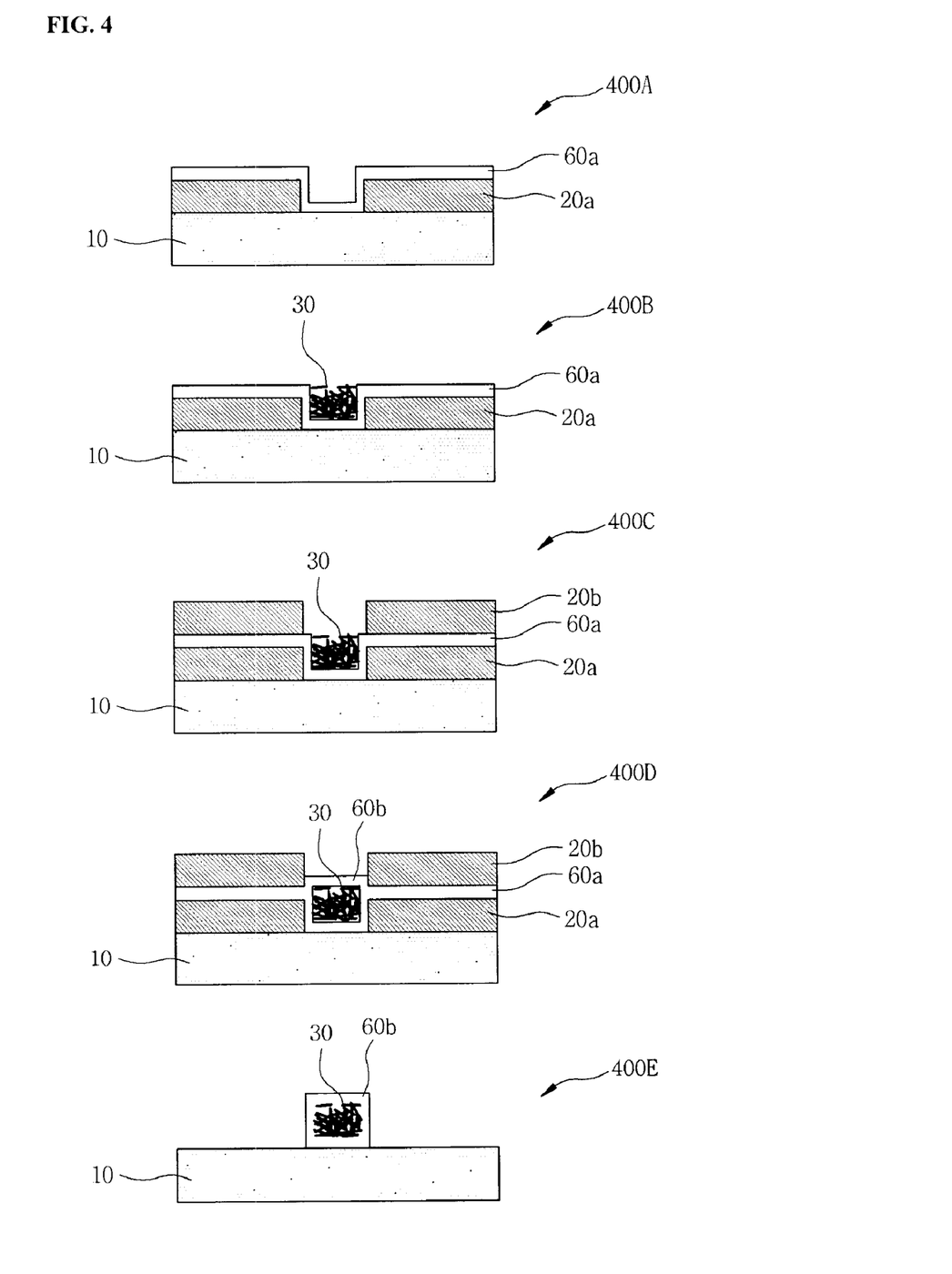
FIG. 4 is a cross-sectional view illustrating sequential processes of a method of forming a semiconductor wire using carbon nanotubes according to the present invention.

FIG. 4 is a cross-sectional view illustrating sequential processes of a method of fabricating a semiconductor device using an electrode with carbon nanotubes according to the present invention.

Reference numeral 400A indicates a step of patterning a portion of an upper surface of the substrate in which carbon nanotubes 30 are desired to be formed with a first mold 20a and then plating a first metal electrode layer 60a thereon. The mold 20a is made of one of photoresist, polymer, a metal, Si, $SiO_2$, an III-IV compound semiconductor, and quartz. The first metal electrode layer 60a that is plated in this step is used as a seed electrode during an electrolysis plating process. Patterning of the first mold 20a is performed through the conventional photolithography process. A recess in which the carbon nanotubes 30 are to be filled is formed at the patterned first mold 20a. Thereafter, the first metal electrode layer 60a is formed by using a sputter or an evaporator and is made of one of Ag, Al, Au, Cu, Co, Ni, Pt, and Zn.

As a follow-up step of plating the first metal electrode layer 60a, reference numeral 400B indicates a step of coating the carbon nanotubes 30 in the recess which is formed by patterning the first mold 20a and on an entire surface of the first metal electrode layer 60a. The carbon nanotubes 30 are one of single-wall nanotubes or multi-wall nanotubes, or a mixture of the single-wall nanotubes and the multi-wall nanotubes. After the carbon nanotubes 30 are dispersed in a solvent through an ultrasonic distributor (for about six hours), they are distributed on the recess and the first metal electrode layer 60a by using a dropper (not shown). The distributed carbon nanotubes 30 are filled in the recess. As the tool, one of a doctor blade, the blade of a knife, a squeegee, a roller, and a flat blade made with a wafer cut section is used.

The substrate 10 with the coated carbon nanotubes 30 and a solvent mounted thereon is dried in a vacuum state to evaporate the solvent, which is repeatedly performed. As other methods, a method of uniformly distributing the dispersed solvent through spinning and a method of evaporating the solvent by applying heat may be also used. As the solvent, one of water, acetone, ethanol, methanol, isopropyl alcohol (IPA), and butyl cellosolve acetate (BCA) may be used. In addition, a volatile organic solvent, which may be used in a laboratory, except for acid, may be also used.

As a follow-up step of filling the carbon nanotubes 30 that are dispersed on an entire surface of the first metal electrode layer 60a in the recess, reference numeral 400C indicates a step of forming a second mold 20b by selectively covering the first metal electrode layer 60a on an upper surface of the carbon nanotubes 30 in order to plate only the carbon nanotubes 30. The selective formation of the second mold 20b for preventing in the first metal electrode layer 60a from performing the plating is performed through the conventional photolithography process.

As a follow-up step of forming the second mold 20b, reference numeral 400D indicates a step of applying a current to the first metal electrode layer 60a as the seed electrode and then performing electrolysis plating on the upper surface of the carbon nanotubes 30 with a second metal electrode layer 60b. By doing this, an adhesive force of the carbon nanotubes 30 can be increased or the carbon nanotubes 30 can be covered with the second metal electrode layer 60b. In addition, metal can be filled between carbon nanotubes 30 by controlling current density applied to the carbon nanotubes 30 and infiltration of a plating solution. The thusly plated carbon nanotubes 30 can be used to improve electrical, electromagnetic, and mechanical characteristics.

As a follow-up step of forming the second metal electrode layer 60b, reference numeral 400E indicates a step of removing the second mold 20b that selectively prevents the electrolysis plating and then removing the edge portions of the first metal electrode layer that is plated between the first and second molds 20a and 20b. Finally, the first mold 20a is removed to form the electrolysis plated carbon nanotubes 30. Removing of the first and second molds 20a and 20b and the edge portions of the first metal electrode layer 60a is performed through the conventional photolithography process.

Figure 5:
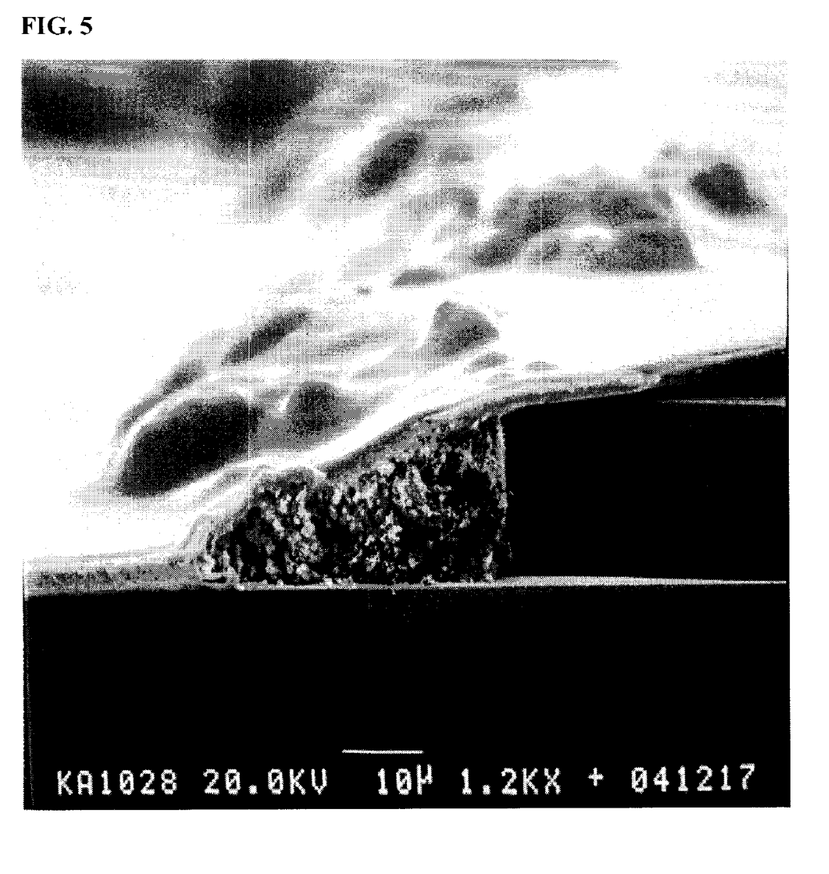
FIG. 5 is a picture of a wire that is made of carbon nanotubes of FIG. 4 taken by an electron microscope.

FIG. 5 is a picture of the element that is obtained by electrolysis-plating of the carbon nanotubes through the semiconductor fabrication method of FIG. 4 taken by an electron microscope.

Method of Fabricating an Inductor Using the Method of Forming the Carbon Nanotubes>

Figure 6:
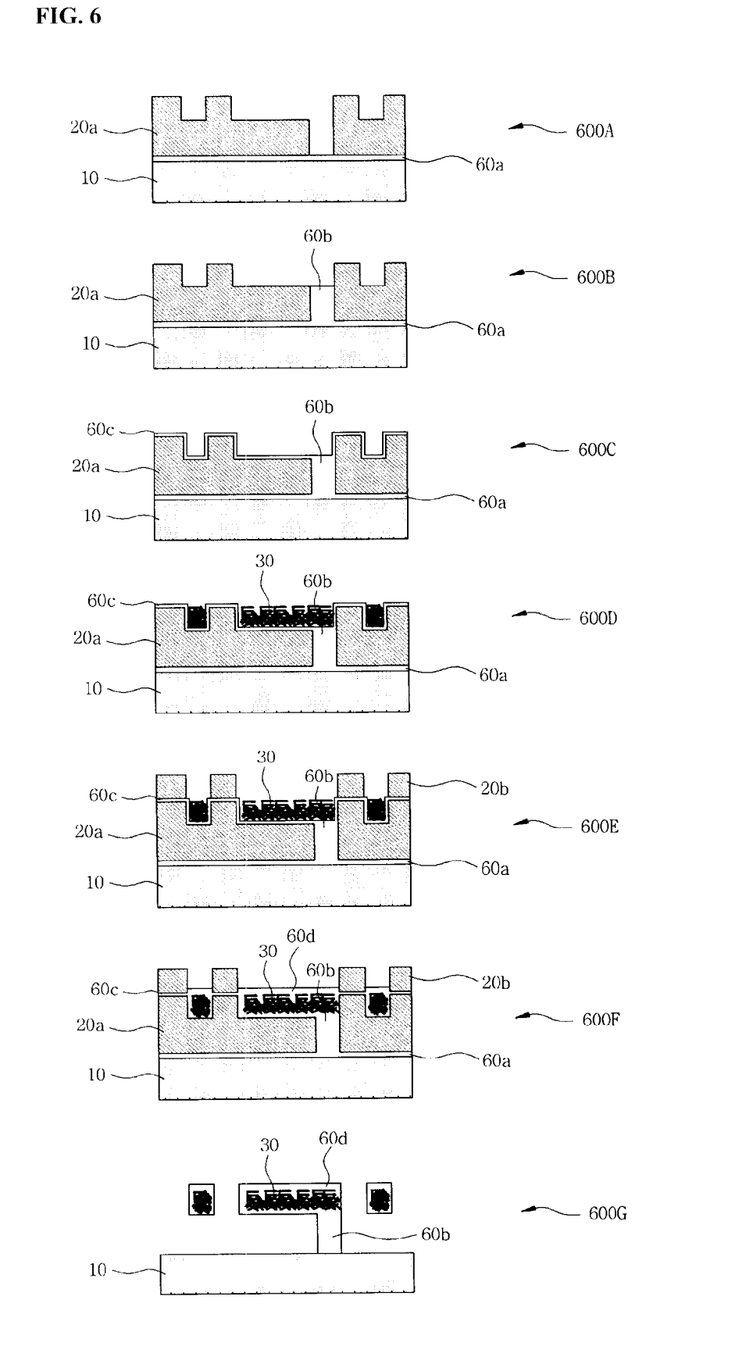
FIG. 6 is a cross-sectional view illustrating sequential processes of a method of fabricating an inductor according to one embodiment of the present invention.

FIG. 6 is a cross-sectional view illustrating sequential processes of a method of fabricating an inductor according to one embodiment of the present invention.

Reference numeral 600A indicates a step of forming the first metal electrode layer 60a for electrolysis plating on the substrate 10. After the first metal electrode layer 60a is formed by using the sputter or the evaporator, the first mold 20a in a three-dimensional shape is patterned through the conventional photolithography process on the upper surface of the first metal electrode layer 60a. A via hole for supporting an inductor and recesses in which the carbon nanotubes 30 are to be filled are formed at the first mold 20a.

As a follow-up step of forming the first metal electrode layer 60a, reference numeral 600B indicates a step of forming a second metal electrode layer 60b by performing electrolysis plating on the via hole for supporting an inductor by using the first mold 20a.

As a follow-up step of forming the second metal electrode layer 60a, reference numeral 600C indicates a step of forming a third metal electrode layer 60c with a uniform metal thickness on an upper surface of the first mold 20a and the via hole. The third metal electrode layer 60c is formed by using the sputter or the evaporator.

As a follow-up step of forming the third metal electrode layer 60c, reference numeral 600D indicates a step of coating the carbon nanotubes 30 on an upper surface of the third metal electrode layer 60c and filling the carbon nanotubes 30 in a recess that is formed by the first mold 20a patterned in a three-dimensional shape. A process of filling the carbon nanotubes 30 in a recess is already described and thus descriptions thereof will be omitted.

As a follow-up step of coating the carbon nanotubes 30, reference numeral 600E indicates a step of making the carbon nanotubes 30 that are filled in the recess dense by using evaporation power of a liquid and then forming the second mold 20b on portions of the upper surface of the third metal electrode layer 60c, except for the recesses with the carbon nanotubes 30 filled therein.

As a follow-up step of forming the second mold 20b, reference numeral 600F indicates a step of forming a fourth metal electrode layer 60d on an upper surface of the carbon nanotubes 30 that are filled within the second mold 20b.

As a follow-up step of forming the fourth metal electrode layer 60d, reference numeral 600G indicates a step of selectively removing the first mold 20a, the second mold 20b, the first metal electrode layer 60a, the second metal electrode layer 60b, the third metal electrode layer 60c, and the fourth metal electrode layer 60d through the conventional photolithography process. Through the above processes, an inductor is finally formed.

<Another Embodiment of a Method of Fabricating the Inductor by Using the Method of Forming the Carbon Nanotubes>

Figure 7:
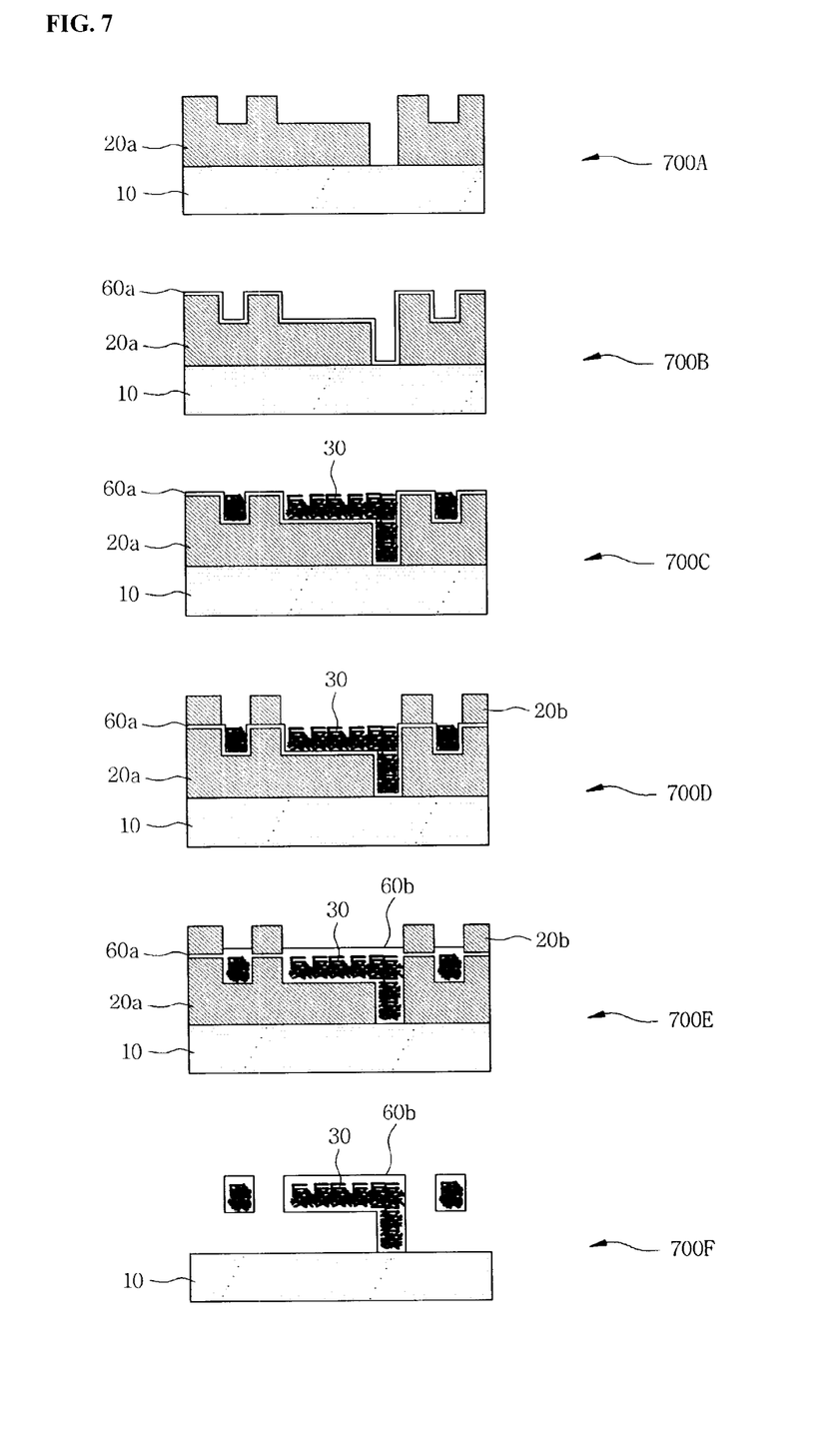
FIG. 7 is a cross-sectional view illustrating sequential processes of a method of fabricating an inductor according to another embodiment of the present invention.

FIG. 7 is a cross-sectional view illustrating sequential processes of a method of fabricating an inductor according to another embodiment of the present invention.

Reference numeral 700A indicates a step of patterning the first mold 20a in a three-dimensional shape in order to form the carbon nanotubes 30 on the substrate 10. At this time, a via hole for supporting an inductor and recesses in which the carbon nanotubes 30 are to be filled are formed at the first mold 20a.

As a follow-up step of patterning the first mold 20a, reference numeral 700B indicates a step of forming the first metal electrode layer 60a on the upper surface of the first mold 20a and the recesses. In this case, the first metal electrode layer 60a is formed by using the sputter or the evaporator.

As a follow-up step of forming the first metal electrode layer 60a, reference numeral 700C indicates a step of coating carbon nanotubes 30 on the upper surface of the recesses and the via hole that are formed at the first mold 20a. A process of filling the carbon nanotubes 30 in a recess that is formed by the first mold 20a patterned in three-dimensional shape is already described and thus descriptions thereof will be omitted.

As a follow-up step of coating the carbon nanotubes 30, reference numeral 700D indicates a step of making the coated carbon nanotubes 30 dense by using evaporation power of a liquid, and then forming the second mold 20b on portions of the first mold 20a, except for the recesses with the carbon nanotubes 30 filled therein.

As a follow-up step of forming the second mold 20b, reference numeral 700E indicates a step of forming the second metal electrode layer 60b on the upper surface of carbon nanotubes 30 that are filled within the second mold 20b.

As a follow-up step of forming the second metal electrode layer 60b, reference numeral 700F indicates a step of selectively removing the first mold 20a, the second mold 20b, the first metal electrode layer 60a, and the second metal electrode layer 60b through the conventional photolithography process. Through these processes, an inductor line and a via hole are formed.

It will be apparent to those skilled in the art that various modifications and variation can be made in the present invention without departing from the spirit or scope of the invention.

Therefore, it should be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

As described above, according to the method of the present invention, a large amount of synthesized and grown carbon nanotubes can be selectively formed on desired portions.

Accordingly, since a method of forming the carbon nanotubes even without using a metal catalyst and a method of allowing the multi-layer process to be performed are provided, the application field of the carbon nanotubes can be enlarged.

In addition, since the process can be performed at a relatively low temperature, various types of molds from polymer such as the most widely used photoresist to a metal mold with a relatively low melting point can be employed, and in this sense, the present invention can be applied in various manners.

Moreover, after the carbon nanotubes are formed in a desired shape, a multi-layer structure can be formed by electrolysis-plating the carbon nanotubes. Accordingly, a method of forming a two-dimensional planar structure and a three-dimensional structure is provided to be variously applied.

The foregoing description of the preferred embodiments of the present invention has been presented for the purpose of illustration and description. It is not intended to be exhaustive or to limit the invention to the precise form disclosed, and modifications and variations are possible in light of the above teachings or may be acquired from practice of the invention. It is intended that the scope of the invention be defined by the claims appended hereto and their equivalents.

What is claimed is:

1. A method of forming carbon nanotubes on a substrate, comprising:
   (a) patterning a mold on an upper surface of the substrate to form a recess;
   (b) coating carbon nanotubes on an upper surface of the recess and an upper surface of the mold;
   (c) filling the carbon nanotubes that are coated on the upper surface of the mold in the recess by using a flattening tool; and
   (d) removing the mold.

2. The method of claim 1, wherein the carbon nanotubes are distributed in a predetermined solvent.

3. The method of claim 2, wherein the solvent is made of one of water, acetone, ethanol, methanol, isopropyl alcohol, and butyl cellosolve acetate.

4. The method of claim 1, wherein the carbon nanotubes are distributed in a solvent, and the solvent is dried after step (b).

5. The method of claim 1, further comprising:
   injecting a liquid into the recess; and
   evaporating the liquid, after the step (c).

6. The method of claim 5, wherein the liquid is one of water, acetone, ethanol, methanol, isopropyl alcohol, and butyl cellosolve acetate.

7. A method of forming semiconductor metal wire using carbon nanotubes, comprising:
   (a) patterning a first mold to form a recess on an upper surface of a substrate and forming a first metal on the substrate in which the first mold is patterned;
   (b) coating carbon nanotubes on an upper surface of the first metal;
   (c) filling the carbon nanotubes that are coated on the upper surface of the first metal in the recess, and forming a second mold on the upper surface of the first metal;
   (d) plating a second metal on an upper surface of a carbon nanotube structure filled in the recess; and
   (e) removing the first mold, the second mold, and the first metal.

8. The method of claim 7, wherein the carbon nanotubes are dispersed in a predetermined solvent.

9. The method of claim 7, wherein the second metal is electrically connected to the first metal by the step (d).

10. The method of claim 7, wherein the plating is performed using a process of filling the carbon nanotube structure with a metal or a process of covering the carbon nanotube structure.

11. The method of claim 7, wherein the first and second molds have the same shape.

12. A method of fabricating an inductor using carbon nanotubes, comprising:
   (a) forming a first metal on an upper surface of a substrate, and then patterning a first mold on an upper surface of the first metal to form a recess and a via hole;
   (b) plating the inside of the via hole with a second metal;
   (c) forming a third metal on the substrate that is formed by the step (b);
   (d) coating carbon nanotubes on the substrate that is formed by the step (c), then filling the coated carbon nanotubes in the recess to form a carbon nanotube structure, and injecting a liquid in the recess;
   (e) patterning a second mold on the substrate that is formed by the step (d);
   (f) plating a fourth metal on an upper surface of the carbon nanotube structure; and
   (g) removing the first mold, the second mold, and the first to third metals,
   wherein the carbon nanotubes are dispersed in a predetermined solvent.

13. The method of claim 12, wherein the first and second molds have the same shape.

14. A method of fabricating an inductor using carbon nanotubes, comprising:
   (a) patterning a first mold on an upper surface of a substrate to form a recess and a via hole;
   (b) forming a first metal on the substrate that is formed by the step (a);
   (c) coating carbon nanotubes on the substrate that is formed by the step (b), then filling the carbon nanotubes in the recess to form a carbon nanotube structure, and injecting a fluid into the recess;
   (d) forming a second mold on an upper surface of the first metal;
   (e) plating a second metal on an upper surface of the carbon nanotube structure; and
   (f) removing the first mold, the second mold, the first metal, and the second metal.

15. The method of claim 14, wherein the first and the second molds have the same shape.

16. A method of forming carbon nanotubes on a substrate comprising:
  (a) patterning a mold on a surface of a substrate to form a recess, the recess exposing a portion of the surface of the substrate;
  (b) providing carbon nanotubes on the exposed portion of the surface of the substrate and an upper surface of the mold;
  (c) filling the recess with the carbon nanotubes that are provided on the upper surface of the mold; and
  (d) removing the mold.

17. The method of claim 16, wherein the carbon nanotubes are provided in a predetermined solvent.

18. The method of claim 17, wherein the solvent is one of water, acetone, ethanol, methanol, isopropyl alcohol, and butyl cellosolve acetate.

19. The method of claim 17, further comprising evaporating the solvent.

20. The method of claim 16, further comprising:
  injecting a liquid into the recess that is filled with the carbon nanotubes; and
  evaporating the liquid to densify the carbon nanotubes in the recess.

21. The method of claim 20, wherein the liquid is one of water, acetone, ethanol, methanol, isopropyl alcohol, and butyl cellosolve acetate.

* * * * *